Sept. 11, 1962 B. J. GUTY 3,053,215

APPARATUS FOR SOLDERING PRINTED SHEETS

Filed Dec. 3, 1956 2 Sheets-Sheet 1

INVENTOR.
Bernard J. Guty
BY Morris [illegible]
ATTORNEY.

Sept. 11, 1962 B. J. GUTY 3,053,215

APPARATUS FOR SOLDERING PRINTED SHEETS

Filed Dec. 3, 1956 2 Sheets-Sheet 2

INVENTOR.
Bernard J. Guty
BY Morris Rabkin
ATTORNEY.

3,053,215
Patented Sept. 11, 1962

3,053,215

APPARATUS FOR SOLDERING PRINTED SHEETS

Bernard J. Guty, Acton, Ind., assignor to Radio Corporation of America, a corporation of Delaware Filed Dec. 3, 1956, Ser. No. 625,812
6 Claims. (Cl. 113—129)

Figure 1:
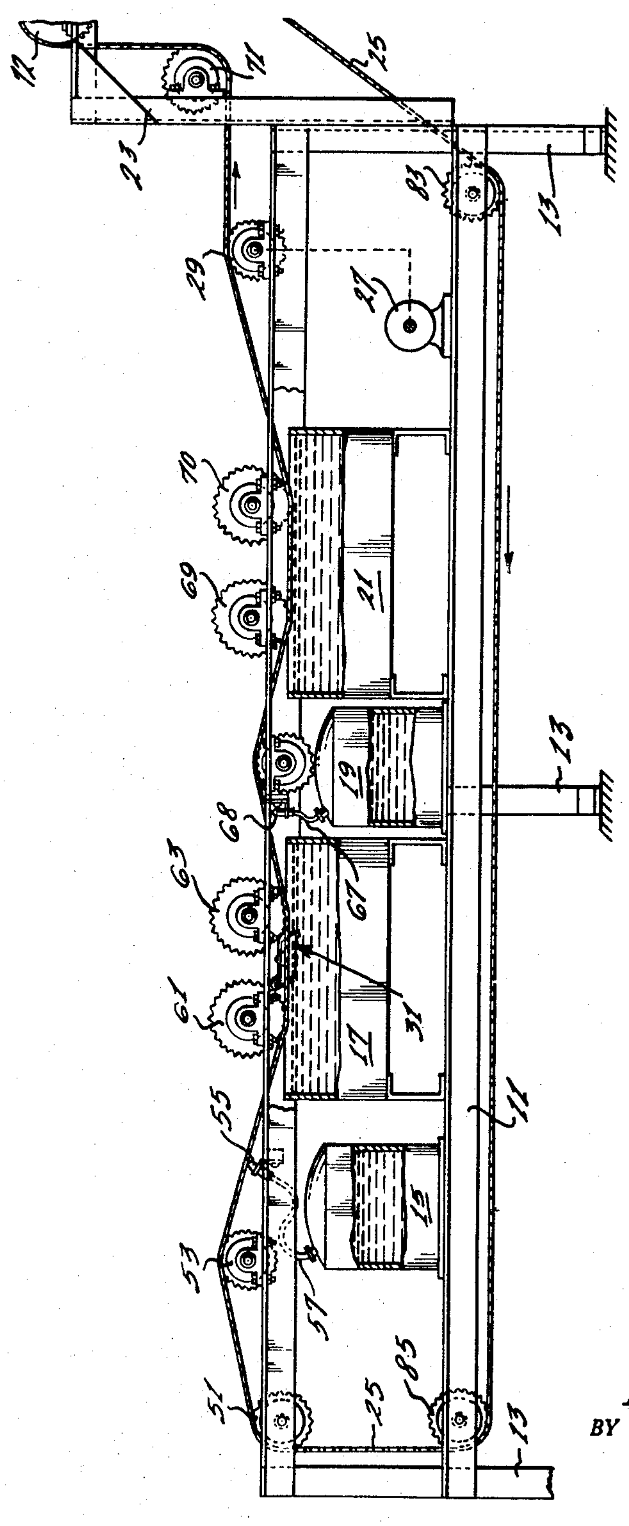

This invention relates to an improved method of and apparatus for soldering, and more particularly to a method of and apparatus for automatically applying solder to a flat surface of a sheet having metallic conductive portions thereon.

The apparatus and method are especially adaptable to the soldering of printed circuits, one common type of which comprises a sheet of electrically insulating material, such as phenolic board, carrying on one surface thereof one or more electrical conductors in the form of thin, flat strips bonded, or otherwise integrally united, to the insulating material.

Where it is desired to mount a number of circuit components on one side of a board of insulating material and connect them at many points, by means of leads extending through apertures in the sheet, to the printed conductors on the other side, there is a considerable problem in making the connections rapidly and efficiently. In a typical printed circuit assembly, over fifty connections may be involved and to make each one of these connections individually with a soldering iron is a tedious process. Consequently, it is desirable to be able to use a process which will enable an operator to solder all of the connections in the same operation or operations. One method of simultaneously soldering all such connections is that of dip-soldering. In this method, the entire side of the assembly containing the printed conductors, with the leads from the circuit components projecting through the various apertures, is dipped face down in a bath of molten solder and removed after a period of immersion. This results in coating the conductors with solder and soldering all of the connections at the same time.

One difficulty in any dip-soldering method is to keep the surface of the solder bath clear of oxides, dross, and other contamination, which interfere with the even application of solder to the conductive portions of the printed circuit. In accordance with the present invention, the surface of the solder bath is swept clear of contamination as each printed circuit assembly is moved across the surface.

Another difficulty in dip-soldering is that the solder tends to bridge across the adjacent conductive portions of the printed circuit, especially if the conductive portions are closely spaced. In accordance with the present invention, the printed circuit is removed at a slight angle with respect to the surface of the solder bath to permit excess solder to drain from the printed circuit. In addition, the printed circuit is coated with molten and heated wax which partially impregnates the insulating portions of the assembly between exposures to first and second solder baths. When the printed circuit is engaged with the second solder bath, this coating of wax causes the solder to flow away from these insulating portions and toward the metallic portions.

An object of this invention is to provide an improved dip-soldering apparatus and method applicable to printed circuits.

Another object of this invention is to provide an improved apparatus for and method of soldering, simultaneously, a large number of conventional components to a sheet having conductive strips integrally united thereto.

A further object of this invention is to provide an improved apparatus and method for the dip-soldering of printed circuits wherein manual handling of the wiring boards is eliminated.

A still further object of this invention is to provide an improved soldering method for removing excess solder from spaces between electrical conductors united to a surface of a body of electrically insulating material.

Apparatus in accordance with the present invention includes a frame supporting two open tanks for molten solder, and containers and applicators for liquid flux and liquid wax. A conveyor includes a pair of sprocket chains supporting a plurality of pallets for carrying the printed sheet assemblies. The conveyor carries the pallets successively to the flux applicator, a first solder tank, the wax applicator, and the second solder tank. The pallets hold the sheets rigidly and position the sheets accurately with respect to the solder bath levels in the solder tanks.

A method in accordance with the present invention includes the steps of applying a liquid flux to the surface of the sheet to be soldered, introducing the sheet surface to a first solder bath at a slight angle with respect to the bath surface, sweeping the bath surface ahead of the sheet, moving the sheet surface in engagement with the bath surface, removing the sheet surface from the bath surface at a slight angle, applying a liquid wax to the sheet surface, and presenting the sheet surface to a second solder bath in the same manner that it was presented to the first solder bath.

Figures 1A, 2, 3:
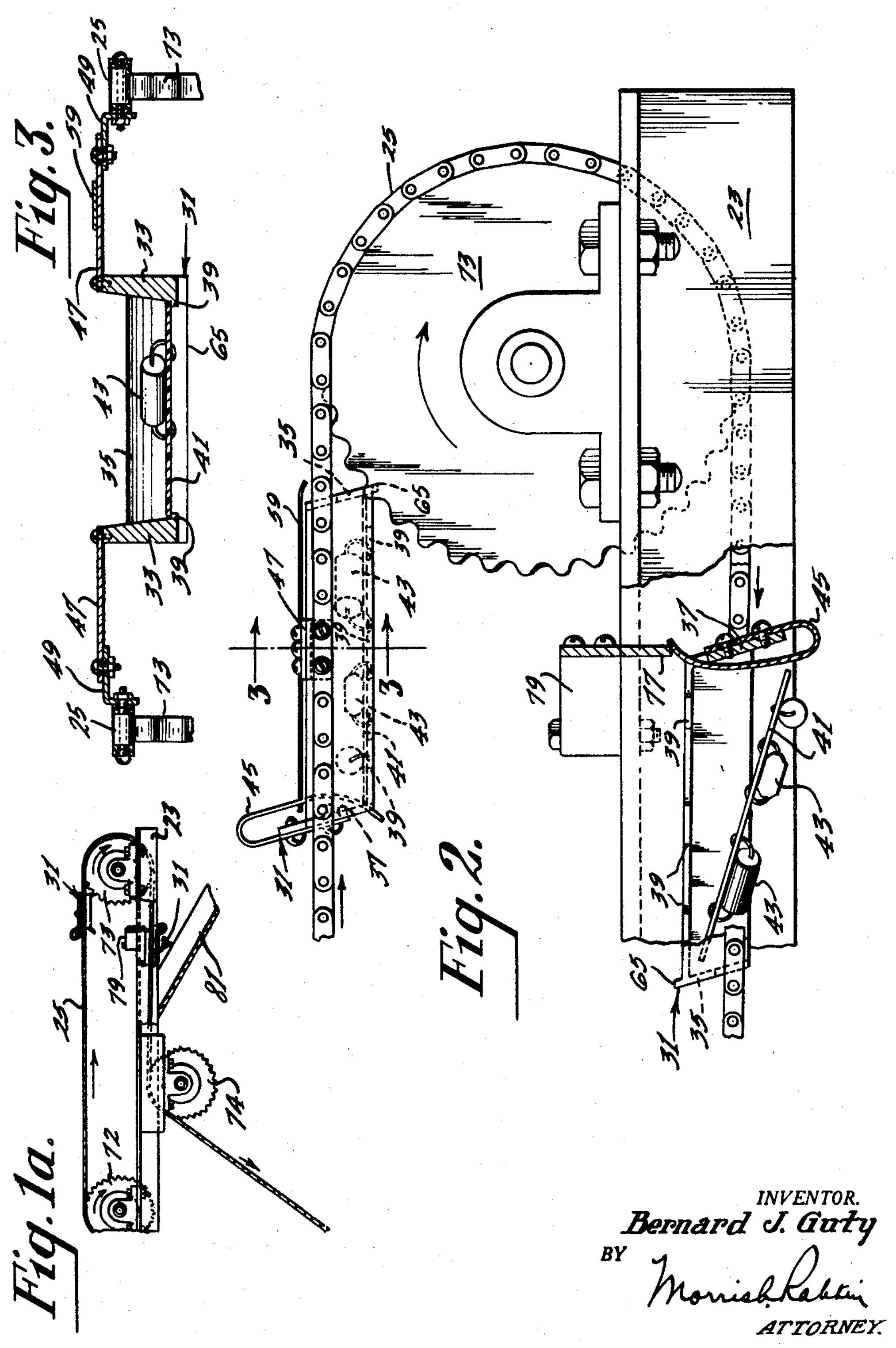

The novel features of the invention, as well as additional objects and advantages thereof, will be understood more fully from the following description when read in connection with the accompanying drawings, in which:

FIGURE 1 is a view in side elevation, partially in section and partially broken away, of a soldering machine in accordance with the present invention;

FIGURE 1*a* is a continuation of FIGURE 1, showing the discharge end of the soldering machine;

FIGURE 2 is an enlarged fragmentary view, partially broken away, of the unload section of the machine and showing the circuit board pallets; and FIGURE 3 is a sectional view taken along the line 3—3 of FIGURE 2, looking in the direction of the appended arrows.

Referring, now, in more detail to the accompanying drawing, FIGURES 1 and 1*a* show an overall side view of a machine in accordance with the present invention, FIGURE 1*a* being an extension of FIGURE 1. The machine is basically contained in an elongated frame structure 11 having supporting legs 13. Supported along a lower level of the frame 11 are a flux tank 15, a first solder tank 17, a wax tank 19, and a second solder tank 21. A heating unit is associated with each of these four tanks and these are not shown separately. Pressure supply and control units may also be required for use with the flux and wax tanks; however, these units are not illustrated. A frame bracket 23 is mounted on the frame 11 at the right hand end of the machine (FIGURE 1) and contains the unload station for the machine. The machine load station is at the left hand end of the machine (FIGURE 1).

The conveyor for the machine comprises two parallel-running endless flat-link pitch chains 25 supported on a plurality of sprocket wheels and supporting a plurality of pallets at spaced intervals. Beginning with the load station at the left end of the machine, the conveyor chains 25 are driven across the top of the machine, passing adjacent to the several processing units mentioned above. The chains then pass to the unload station and from there return to the load station underneath the frame 11. The chains 25 are driven at constant speed by means of a motor 27 through sprocket wheels 29.

A plurality of pallets 31 are supported on the chains 25, only several of these pallets being shown in FIGURES 1 and 1*a*. Any number of pallets 31 may be secured to the conveyor and this will depend, to some extent, on pallet size, conveyor speed, etc.

Referring now particularly to FIGURES 2 and 3 of the accompanying drawings, the pallets 31 will be described in detail. For purposes of the description, the pallet will be assumed to be disposed in a horizontal plane. Each pallet 31 consists essentially of a rectangular frame defining open bottom and top surfaces. The side walls 33 are essentially vertical, while the end walls 35 and 37 are slightly inclined with respect to the vertical in planes substantially parallel to each other. The end wall 35 forms the leading end of the pallet 31 as it is carried by the conveyor chains 25. A plurality of tabs 39 extend inwardly from the side walls 33 at the bottom of the pallet. These tabs support a printed circuit board 41 in a plane adjacent the bottom of the pallet frame. The printed circuit board 41 consists, for example, of a phenolic sheet having conductive portions bonded thereto on one surface, and a plurality of components 43 mounted on the opposite surface and connected to the conductive portions through apertures in the sheet. The end wall 35 forms an acute angle with respect to the plane of the printed circuit board when it is inserted in the pallet and provides a wedging action to hold down the leading end of the circuit board. The end wall 37 is inclined at an obtuse angle with respect to the plane of the printed circuit board. A strip of spring metal is mounted on the end wall 37, extending upwardly from the wall and being folded inwardly and downwardly with respect to the pallet 31 so that its free end extends below the bottom surface of the pallet frame. This strip forms a spring 45 which bears against the trailing edge of the printed circuit board 41, urging it forward to the above described wedged position, and downward to firmly hold the circuit board in position against the tabs 39 within the pallet 31. The pallet is supported by a pair of arms 47 which are mounted at the upper edges of the side walls 33 intermediate the ends thereof and extend outwardly from the side walls in the plane of the upper frame surface. The pallet arms 47 are, in turn, secured to angle brackets 49 which are fastened to opposite facing links of the pair of conveyor chains 25. It will be noted, with particular reference to FIGURE 3, that the plane of the printed circuit board 41 is spaced from the supporting plane defined by the arms 47. With this arrangement the conveyor chains 25 are somewhat removed from the solder bath surfaces while the printed circuit board is contacted with the solder baths.

The loading station of the machine is located between sprocket wheels 51 and 53. The fluxing station is located adjacent the sprocket wheel 53 in the direction of movement of the conveyor chains 25. The fluxing station comprises a spray nozzle 55 which is connected to the flux tank by means of a hose 57. As a pallet 31 passes over the flux nozzle 55, a switch, which controls a valve to discharge a flux spray through the nozzle, is engaged by the pallet. The switch (not shown) is engaged by a runner cam 59 mounted on the pallet. A runner cam 59 is shown in FIGURES 2 and 3 of the drawing mounted on one of the pallet arms 47. The length of the cam 59 is substantially the length of the circuit board 41 and the cam is vertically aligned with the board so that the switch will be actuated during the entire time the circuit board is passing over the nozzle 55. In this manner, a uniform amount of flux will be sprayed over the surface of the circuit board.

At the first solder station, represented by the solder tank 17, the conveyor chains are maintained horizontal by the two sets of sprocket wheels 61 and 63. The solder level is maintained in the tank so that when a pallet 31 is positioned between the two sets of sprocket wheels, the top of a circuit board 41 mounted in the pallets will be at or near the solder level. It will be noted that the pallet enters and leaves the solder bath at a slight angle. While this is, of course, advantageous from a standpoint of physical arrangement, it also serves two other important functions.

Referring again to FIGURES 2 and 3 of the drawing, the leading end wall 35 of the pallet 31 extends below the plane defined by the bottom of the pallet to form a ridge 65. This ridge 65 acts as a wiper blade for the pallet when it enters the surface of the solder bath and sweeps away the surface contamination so that perfectly clean solder engages the circuit board when the pallet levels out after rounding the first set of sprocket wheels 61. The bath surface, of course, is continuously swept by blade as the pallet is carried across the bath surface. As the pallet 31 now leaves the solder bath after rounding the set of sprocket wheels 63, excess solder will drain from the leading edge of the circuit board toward the trailing edge due to the inclined angle of the pallet. This reduces some bridging which might occur between closely spaced conductive portions on the circuit board.

The waxing station is positioned between the first and second solder tanks 17 and 21, respectively. At this station liquid wax is presented to the circuit board from the wax tank 19 by means of a hose 67 and nozzle 68 in the same manner as the flux is applied. The wax impregnates the non-metallic portions of the circuit board to some extent, aided by the heat contained in the board, and also by the fact that the wax is previously heated. At the second solder station, the pallet 31 is maintained level with respect to the bath surface by the sprocket wheels 69 and 70. The pallet is contacted with the second solder bath in the same manner that it was contacted with the first solder bath. In this bath, however, the solder tends to flow away from the non-metallic portions of the circuit board 41 due to the wax impregnated surface. As the pallet is drawn across the second bath, any solder bridges, which may have previously formed, are melted away and the wax tends to prevent these bridges from reforming. Again, excess solder drains from the circuit board as the pallet leaves the second solder bath at a slight inclination.

The pallet is then carried to the unload station of the machine, the conveyor chains passing over sets of sprocket wheels 71 and 72. The unload station is located between the set of sprocket wheels 73, which reverses the chain direction, and the set of sprocket wheels 74. At this station, which is illustrated in detail in FIGURE 2, the pallet 31 is inverted. To effect release of the circuit board 41 from the pallet, a tab 77 is mounted on a cross member 79 secured to the frame bracket 23. The tab 77 extends downwardly to a position to engage the free end of the pallet spring 45 as the pallet passes the tab. By this means the spring 45 is deflected away from the trailing end of the circuit board 41 releasing the force which holds the circuit board in the pallet and permitting the circuit board to drop out of the pallet by means of gravity. A chute 81 may be provided beneath the unload station to direct the circuit boards 41 to a conveyor or work table for further processing. The conveyor chains 25 then pass underneath the machine frame 11 engaging sets of sprocket wheels 83 and 85 and return to the load station to complete the machine cycle.

The process in accordance with the present invention may be practiced in the following manner. A printed circuit board 41 is placed in a pallet 31 having an open bottom, so that the surface of the circuit board having the conductive portions is exposed at the bottom surface of the pallet having a wiper blade 65 at its leading end. The pallet is carried past a flux spray nozzle 55 wherein the exposed surface of the circuit board is coated with a solder flux. The pallet is then introduced to a first solder bath in the tank 17 at a slight angle with respect to the surface. The wiper blade 65 of the pallet first engages the surface of the solder to sweep the surface contamination ahead of the pallet. The exposed surface of the circuit board is then contacted with clean solder and is carried across the tank 17 for some distance in contact with the solder. The pallet is then carried out of the solder bath at a slight angle with respect to the surface thereof to permit draining of excess solder from the circuit board. The pallet is then carried past the wax spray nozzle where the exposed surface of the circuit board is coated with a liquid wax which impregnates the non-metallic portions of the exposed surface. The pallet and circuit board are then contacted with the second solder bath in the same manner that they were contacted with the first solder bath. The wax impregnated surface resists attraction of the solder causing it to flow to the metallic portions of the exposed surface.

A number of advantages are provided by the above described machine, in addition to the fact that the machine is completely automatic from the loading of the printed circuit boards into the pallets to and including the discharge or unloading of the circuit boards from the pallets. Due to the particular structure of the pallets, the circuit boards are rigidly held in a flat supporting plane under the constant force applied by the spring 45. The spring holding force alone may be sufficient to take small warps out of the circuit boards as they are loaded into the pallets. In the event of a more substantial warp in the printed circuit, this may be taken out by the above described force when the circuit board comes under the influence of the heat from the first solder bath. That is, the heat in combination with the force tending to urge the board into its desired supporting plane will remove the warp and prevent the board from further warping.

Another advantage of the machine is that the printed circuit boards are held perfectly flat with respect to the solder level in each solder bath. This is accomplished by the above described rigid holding of the boards within the pallets and further by the control of the pallet travel across the surfaces of the solder baths.

What is claimed is:

1. A machine for soldering sheets comprised of a phenolic base having conductive portions on a surface thereof; said machine comprising a frame; continuous conveyor means mounted on said frame; first and second open tanks mounted on said frame for containing molten solder; liquid wax applying means mounted on said frame between said solder tanks: liquid flux applying means mounted on said frame adjacent one of said solder tanks; a plurality of pallets having upper and lower open faces mounted on said conveyor means for supporting individual sheets; means for driving said conveyor means to pass said pallets adjacent said flux applying means, said first solder tank, said wax applying means, and said second solder tank, successively; said pallets carrying said boards in a path spaced from said conveyor means; and means associated with said conveyor means for guiding said pallets into and out of engagement with said molten solder in said containers at a slight angle with respect to the surface of the solder.

2. A machine for soldering a surface of a sheet, said sheet surface having conductive and non-conductive portions, said machine comprising a frame, means for applying liquid flux to a sheet surface, means for containing a first bath of molten solder, means for applying liquid wax to a sheet surface, means for containing a second bath of molten solder, said above named means being mounted at successive positions along said frame, a continuous conveyor, a plurality of pallets having upper and lower open faces mounted on said conveyor, each pallet being adapted to support a sheet and to expose the surface to be soldered at the lower face of the pallet, means for driving said conveyor to present the lower faces of said pallets to said flux and wax applying means and to said solder baths, and means guiding said conveyor to guide said pallets into and out of said solder baths at a small angle with respect to the surfaces of said baths and for guiding said pallets in engagement with the surfaces of said baths.

3. Apparatus for use in conveying printed circuit boards in an automatic soldering machine, said apparatus comprising a pair of endless sprocket wheel chains driven in a parallel course, a plurality of pallets mounted between said chains, each of said pallets comprising a rectangular frame defining open faces on opposite sides of said frame, a plurality of tabs extending inwardly from said frame to support a circuit board in the plane of one of said faces, a pair of arms extending outwardly from said frame in the plane of the other of said faces, means associated with said arms for securing said arms to opposite facing links of said pair of chains, one end of said frame defining the leading end of said pallet and comprising a wiper blade extending beyond the plane of said one face, and spring means mounted at the other end of said frame defining the trailing end of said pallet to resiliently hold a printed circuit board in engagement with said tabs, said spring means being adapted to be deflected to free said printed circuit board for removal from said pallet.

4. A pallet for conveying sheets in an automatic soldering machine, said pallet comprising a rectangular frame defining substantially parallel open faces, a plurality of tabs extending toward each other from two sides of said frame to support a sheet in the plane of one of said faces, a pair of rigid arms extending outwardly from the sides of said frame in the plane of the other of said faces for supporting said pallet on a conveyor, one end of said frame which defines the leading end of the pallet comprising a wall adjacent to the end of a sheet disposed in said pallet, said wall extending downwardly below said one face, and resilient means mounted on said frame for securing a sheet in said pallet.

5. A pallet for conveying printed circuit boards in an automatic soldering machine, said pallet comprising a rectangular frame defining substantially parallel open faces, a plurality of tabs extending toward each other from two sides of said frame in the plane defined by one of said faces, said tabs being adapted to support the sides of a printed circuit board, a pair of rigid arms extending outwardly from the sides of said frame in the plane defined by the other of said faces for supporting said pallet on a conveyor, one end of said frame defining a blade adjacent to the end of a printed circuit board disposed in said pallet, said blade extending downwardly below said one face, a spring mounted at the other end of said frame and extending into said frame, and said spring being adapted to resiliently urge a printed circuit board against said tabs and said one end of said frame to secure said board in said pallet.

6. For use in apparatus for conveying printed circuit boards to solder baths for dip soldering, a pallet for supporting a printed circuit board, said pallet comprising a rectangular frame having open upper and lower faces, a pair of side walls substantially perpendicular to said lower face, a plurality of tabs extending from said side walls toward each other in the plane of said lower face, means extending outwardly from said side walls for supporting said pallet on a conveyor, a leading end wall having an inner face inclined at an acute angle with respect to said lower face, said leading end wall extending downwardly below said lower face, a trailing end wall having a portion of its lower edge lying above the plane of said lower face, a spring mounted adjacent the top of said trailing end wall extending inwardly and downwardly below said lower face for resiliently urging a board against said tabs and the apex of the angle of said leading end wall with respect to said lower face to secure said board in said pallet, and the end of said spring extending below said lower face being adapted to be urged toward said trailing end wall to free said board for removal from said pallet.

References Cited in the file of this patent

UNITED STATES PATENTS

| | | |
|---|---|---|
| 250,096 | Norton | Nov. 29, 1881 |
| 301,579 | Edwards | July 8, 1884 |
| 479,174 | Quentell | July 19, 1892 |
| 1,619,406 | Emert | Mar. 1, 1927 |
| 1,783,642 | Ferguson et al. | Dec. 2, 1930 |
| 1,785,762 | Bundy | Dec. 23, 1930 |
| 2,671,264 | Pessel | Mar. 9, 1954 |
| 2,740,193 | Pessel | Apr. 3, 1956 |
| 2,770,875 | Zimmerman | Nov. 20, 1956 |
| 2,803,216 | Termini et al. | Aug. 20, 1957 |
| 3,000,342 | Dorosz et al. | Sept. 19, 1961 |